(12) United States Patent
Boureau et al.

(10) Patent No.: US 10,884,379 B2
(45) Date of Patent: Jan. 5, 2021

(54) METHOD OF ACQUIRING HOLOGRAMS BY OFF-AXIS ELECTRON HOLOGRAPHY IN PRECESSION MODE

(71) Applicant: COMMISSARIAT A L'ENERGIE ATOMIQUE ET AUX ENERGIES ALTERNATIVES, Paris (FR)

(72) Inventors: Victor Boureau, Grenoble (FR); David Cooper, Uriage les Bains (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 22 days.

(21) Appl. No.: 16/196,365

(22) Filed: Nov. 20, 2018

(65) Prior Publication Data
US 2019/0155218 A1 May 23, 2019

(30) Foreign Application Priority Data

Nov. 22, 2017 (FR) .................................... 17 61062

(51) Int. Cl.
| | | |
|---|---|---|
| *H01J 37/22* | (2006.01) | |
| *H01J 37/26* | (2006.01) | |
| *G03H 5/00* | (2006.01) | |
| *H01J 37/295* | (2006.01) | |
| *G03H 1/04* | (2006.01) | |

(52) U.S. Cl.
CPC ............. *G03H 5/00* (2013.01); *G03H 1/0402* (2013.01); *H01J 37/22* (2013.01); *H01J 37/26* (2013.01); *H01J 37/295* (2013.01); *G03H 2224/04* (2013.01); *H01J 2237/2614* (2013.01)

(58) Field of Classification Search
CPC ......... H01J 2237/2614; H01J 2237/228; H01J 37/22; H01J 37/26; H01J 37/295
See application file for complete search history.

(56) References Cited

U.S. PATENT DOCUMENTS

| | | | | |
|---|---|---|---|---|
| 5,192,867 A * | 3/1993 | Osakabe | ............... | H01J 37/147 250/311 |
| 5,500,527 A * | 3/1996 | Zarubin | ............... | H01J 37/265 250/311 |
| 6,617,580 B2 * | 9/2003 | Voelkl | ..................... | H01J 37/26 250/307 |

(Continued)

OTHER PUBLICATIONS

U.S. Appl. No. 15/703,557, filed Sep. 13, 2017, 2018/0076005 A1, Benedikt Haas et al.
French Preliminary Search Report dated Aug. 28, 2018 in French Application 17 61062 filed on Nov. 22, 2017 (with English Translation of Categories of Cited Documents).

(Continued)

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

Method for acquisition of at least one hologram of a sample by off-axis holography using a transmission electron microscope, the microscope comprising an electron beam source, at least one objective lens, a sample holder, at electron biprism and means of displacing the electron beam in precession mode upstream from the sample holder and a compensator of the precession downstream from the sample holder, said method comprising the activation of means of displacing the electron beam in precession mode and the compensator and acquisition of a hologram of said sample in precession mode.

16 Claims, 4 Drawing Sheets

(56) References Cited

U.S. PATENT DOCUMENTS

| | | | | |
|---|---|---|---|---|
| 7,417,227 | B2* | 8/2008 | Matsumoto | H01J 37/244 250/306 |
| 8,502,143 | B2 | 8/2013 | Hytch et al. | |
| 8,785,851 | B2* | 7/2014 | Tanigaki | H01J 37/295 250/311 |
| 2008/0210868 | A1* | 9/2008 | Kohashi | H01J 37/265 250/311 |
| 2009/0078869 | A1* | 3/2009 | Matsumoto | H01J 37/26 250/311 |
| 2010/0038537 | A1* | 2/2010 | Benner | H01J 37/26 250/311 |
| 2011/0031395 | A1* | 2/2011 | Harada | H01J 37/28 250/307 |
| 2012/0241612 | A1* | 9/2012 | Harada | H01J 37/26 250/311 |
| 2014/0197312 | A1* | 7/2014 | Harada | H01J 37/243 250/307 |
| 2016/0196952 | A1* | 7/2016 | Matsumoto | H01J 37/295 250/305 |

OTHER PUBLICATIONS

Cooper, D. et al.: "Strain mapping of semiconductor specimens with nm-scale resolution in a transmission electron microscope", Micron, vol. 80, 2016, pp. 21.

Houdellier, F. et al. "Diffracted phase and amplitude measurements by energy-filtered convergent-beam holography (CHEF)", Ultramicroscopy, vol. 108, No. 3, 2007, pp. 10.

P.A. Midgley: "An introduction to off-axis electron holography", Micron, vol. 32, No. 2, 2000, pp. 18.

Hytch, M.J, et al. "Dark-field electron holography for the measurement of geometric phase", Ultramicroscopy, vol. 111., No. 8, 2011, pp. 10.

Zhaofeng, G. et al. "Determination of Mean Inner Potential and Inelastic Mean Free Path of ZnTe Using Off-Axis Electron Holography and Dynamical Effects Affecting Phase Determination", Microscopy & Microanalysis, vol. 21, No. 06, 2015, pp. 7.

Voelkl, E. et al. "Approaching routine $2\pi/1000$ phase resolution for off-axis type holography", Ultramicroscopy, vol. 110, No. 5, 2010, pp. 13.

\* cited by examiner

FIG.8

METHOD OF ACQUIRING HOLOGRAMS BY OFF-AXIS ELECTRON HOLOGRAPHY IN PRECESSION MODE

TECHNICAL DOMAIN AND STATE OF PRIOR ART

This invention relates to a method of acquiring holograms by off-axis electron holography in order to obtain phase images containing attenuated artefacts.

The principle of holography was invented by Dennis Gabor in 1948, for electron optics. This imagery technique can be used to record interference figures or holograms formed in a transmission electron microscope. This technique can then be used to reconstruct the electron beam wave front, and to deduce its phase. One of the most frequently used configurations for transmission electron microscopy is called off-axis electron holography as described in the document "*An Introduction to off-axis electron holography*", Midgley, P. A. Micron 32, 167-184 (2001). This configuration uses an electron biprism, also called a Möllenstedt biprism, to deviate electrons.

A hologram is recorded between the reference wave and the wave that passed through the object using a Möllenstedt biprism installed at the area selection diaphragm of the microscope. This biprism is used to superpose part of the electron beam (reference wave) and the other part that passed through the sample (diffused wave) and thus form the interference pattern.

Unlike classic imagery for which the image of interest is the intensity perceived by the detector, off-axis electron holography records an interferogram from which the phase image of the sample can be reconstructed directly. This phase image of the sample is sensitive to different physical fields such as the electrical potential or the magnetic potential. With the use of a specific dark field configuration, holography is sensitive to the mechanical deformation field as described in document U.S. Pat. No. 8,502,143. Furthermore, the phase image is quantitative. Consequently, the phase image can be used to detect the presence of one of several physical fields and it can be transformed into a measurement of the studied physical field as described for example in the document by M. J. Hÿtch, F. Houdellier, F. Hüe, and E. Snoeck, *Ultramicroscopy* 111, 1328 (2011).

But off-axis electron holography is sensitive to the effects of diffraction of electrons that occurs when crystalline samples are measured, which generates artefacts in the phase image for which the quantitative measurement then becomes incorrect.

In order to reduce these artefacts, great care is taken with the preparation of samples, particularly to avoid non-homogeneous curvatures and thicknesses. Such sample preparation can be very restrictive.

The document by Gan, Z., DiNezza, M., Zhang, Y.-H., Smith, D. J. & McCartney, M. R. *Microscopy and Microanalysis* 21, 1406-1412 (2015) describes the existence of these artefacts and proposes to attenuate them by adapting the crystalline orientation of the sample relative to the electron beam. In particular, the manipulator keeps away from the main crystalline orientations.

PRESENTATION OF THE INVENTION

Consequently, one purpose of this invention is to disclose a method of acquiring holograms by electron holography to obtain attenuated artefacts, related to diffraction effects.

The purpose mentioned above is achieved by a method of acquiring phase images by off-axis electron holography, the acquisition being made in precession mode.

Precession mode means that the incident beam makes at least one revolution, the incident beam forming an angle from the optical axis of the microscope, and generates a precession cone. The angle may or may not be constant. In the case of a symmetric precession cone generated by a circle, the cone angle is called the precession angle.

The inventors thought about making off-axis holography in precession mode, while precession mode is used in electron microscopy for the acquisition of diffraction patterns so as to obtain intensities representative of kinematic diffraction conditions.

Precession of the electron probe can attenuate artefacts related to diffraction effects in the phase image obtained due to electron holography in the case of a crystalline sample. These phenomena are particularly important in the presence of a variation of the crystal thickness, a large thickness due to dynamic diffraction effects and/or changes in orientation due to curvature, a poly-crystalline sample, etc.

According to the invention, it is the phase image that is directly affected by precession of the probe, and not an intensity image as is the case in methods using precession conventionally.

Due to the invention, preparation of samples can be less restrictive.

The method may comprise:
a first adjustment phase including the following steps:
alignment of the electron microscope in holography mode,
alignment of the microscope in precession mode,
check the stability of the sample in the image plane and the stability of the diffraction,
insertion of the biprism and adjustment of the biprism characteristics,
check the stability of the sample and the hologram in the image plane, a second phase to acquire at least one hologram.

Alignment in holography mode comprises for example adjustments of objective, diffraction and intermediate lenses.

Advantageously, these adjustments are no longer modified before the hologram is acquired.

The application describes a method for acquisition of at least one hologram of a sample by off-axis holography using a transmission electron microscope, said microscope comprising an electron beam source, at least one objective lens, a sample holder, at least one electron biprism and means of displacing the electron beam in precession mode upstream from the sample holder and means of compensation for precession downstream from the sample holder, said method comprising the activation of means of displacing the electron beam in precession mode and means for compensating the precession and acquisition of a hologram of said sample in precession mode.

Advantageously, in a first phase, the acquisition method comprises the following steps, after placement of the sample in the microscope:
alignment of the electron microscope in holography mode without electron biprism,
alignment of the electron microscope in precession mode,
check the stability of the image of the sample in the image plane and diffraction stability of the microscope,
install the electron biprism in the microscope and adjust the characteristics of said electron biprism, check the stability of the sample and the hologram in the image plane, in a second phase, acquire at least one hologram.

For example, the stability of the image of the sample in the image plane is considered to be sufficient when its displacement is less than the required measurement resolution, and the diffraction stability is sufficient when the operator considers that it is visually stable.

Preferably, if the stability of the image of the sample in the image plane and the diffraction stability of the microscope are not sufficient, the alignment step in precession mode is at least partly repeated. Advantageously, the height of the sample relative to an objective lens is modified before the alignment step in precession mode is repeated.

The acquisition method may comprise a step to verify the stability of the image of the sample and the hologram in the image plane, after the electron biprism has been put into place in the microscope and the characteristics of said electron biprism have been adjusted.

For example, the image of the sample in the image plane is considered to be sufficient when the movement of the sample is less than the required spatial resolution, and the stability of the hologram is sufficient when its contrast is at least 5%.

In one advantageous example, if the stability of the image is not satisfactory, the step to acquire at least one hologram is an acquisition of discrete holograms.

Preferably, precession mode is activated during the alignment step in holography mode or not later than at the beginning of the alignment step in precession mode.

For example, the precession angle is not zero during adjustment of the characteristics of said electron biprism.

Advantageously, said electron biprism is inserted during adjustment of the precession.

The precession angle may be adjusted to a value given for the acquisition of said at least one hologram, at least at the beginning of the second phase.

The application also describes a method of obtaining at least one phase image of a sample, comprising the method of acquiring at least one hologram according to the invention and a step to obtain at least one phase image by processing of said at least one hologram obtained at the end of the acquisition method.

The application also describes a method of determining at least one physical field of a sample comprising the method of obtaining at least one phase image according to this invention and a processing step of said phase image to determine said physical field.

BRIEF DESCRIPTION OF THE DRAWINGS

This invention will be better understood after reading the following description and the appended drawings on which.

DETAILED PRESENTATION OF PARTICULAR EMBODIMENTS

In the following description, the terms "beam" and "probe" are both used to designate the electron beam of the microscope.

Figures 1A, 1B:
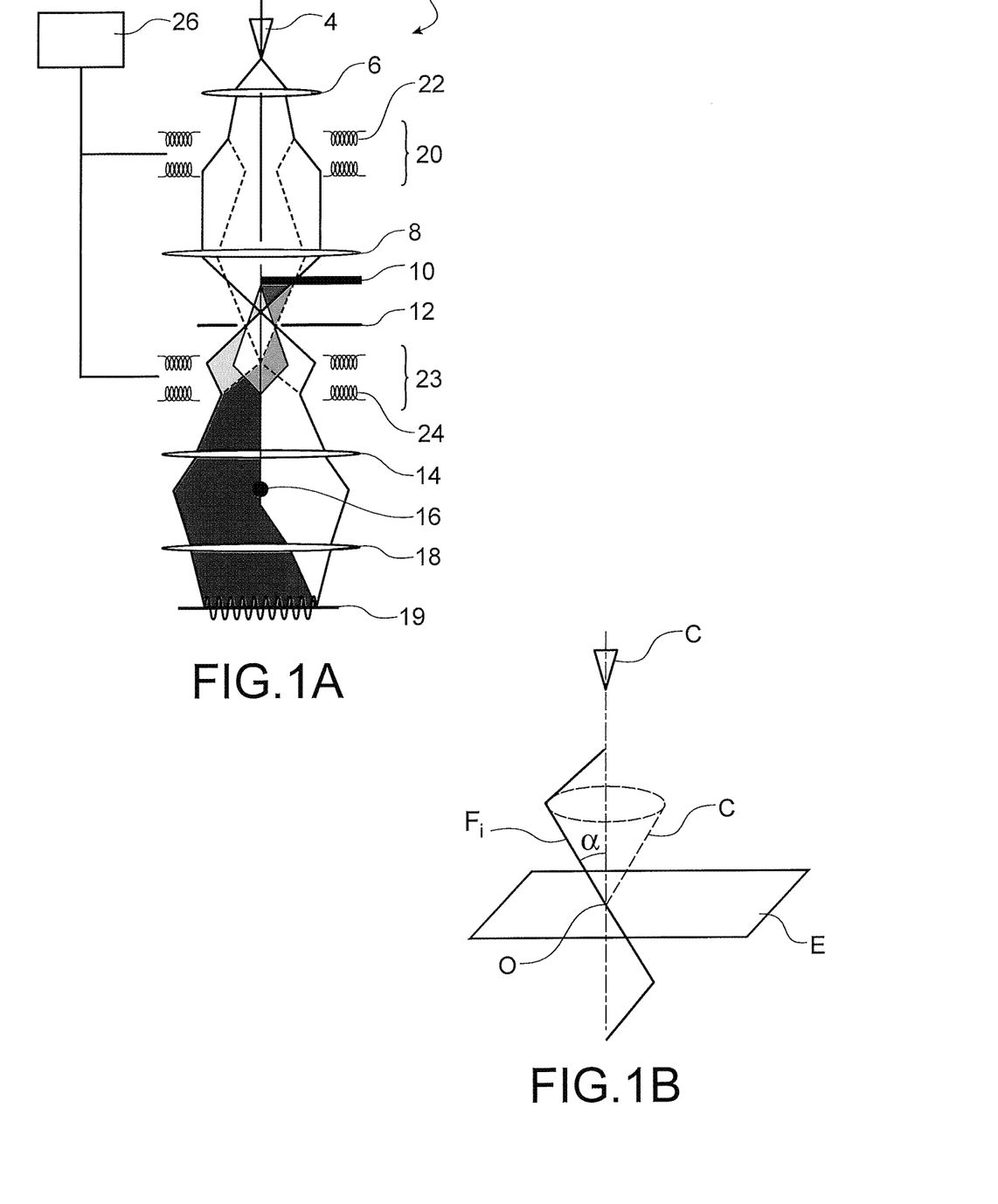
FIG. 1A is a diagrammatic view of a transmission electron microscope for implementation of the acquisition method according to the invention.
FIG. 1B is a diagrammatic representation of the deviated beam in precession mode.

FIG. 1A is a diagrammatic representation of an example of a transmission electron microscope that can make use of a method of acquiring phase images of samples according to the invention.

The sample is the environment for which it is required to acquire one or more phase images and from which for example the physical field(s) of this environment can be determined.

The sample E may be a crystalline and/or amorphous solid environment, for example a semiconducting material, to determine a physical field of this environment.

The transmission electron microscope 2, subsequently referred to as TEM, can comprise, in the order listed, an electron source 4 producing an electron beam, a condenser system 6, an objective lens 8, a sample holder 10, an objective diaphragm 12, an intermediate lens 14, an electron biprism 16 or Möllenstedt biprism, a projector system 18 and a screen 19 on which the hologram is formed.

The microscope also comprises means of illumination in precession mode. For example, these means comprise means 20 of provoking a deflection of the incident beam. For example these means comprise coils 22 between the condenser system and the objective lens. The coils 22 are electrically powered so as to produce a magnetic field capable of causing a deflection of the incident electron beam Fi by a deflection angle α from the optical X axis, called the precession half-angle, such that as the incident beam is displaced, it generates a precession cone C like that shown on FIG. 1B. The fixed point O about which the incident beam Fi rotates corresponds to the analysed zone of the sample. Values of α can vary from 0.01° to 5° and preferably between 0.1° and 1°. This deflection is also called "scan".

Advantageously, the means of making illumination in precession mode also comprise means 23 of compensating the effect of deflection of the incident beam Fi on the transmitted beam. These means are placed after the sample. For example, these compensation means comprise coils 24 upstream the objective lens that are electrically powered so as to produce a magnetic field capable of compensating for the effect of deflection of the incident beam Fi on the transmitted beam. This compensation is also called "descan" correction.

The incident electron beam is rotating, thus due to precession, it forms a cone, the vertex of which is located on the sample as shown on FIG. 1B.

As an alternative, precession can be made by rotating the sample.

The precession means are connected to a control unit 26.

The method of acquiring at least one hologram according to the invention comprises the acquisition of at least one hologram in off-axis holography mode in precession mode. Means of displacing the electron beam in precession made and precession compensation means are used during acquisition of the hologram, to achieve this. The hologram thus obtained can be used to obtain a phase image with averaging of diffraction effects along the precession cone, and thus fewer artefacts related to diffraction effects.

The acquisition method can take place in a first phase I for adjustment of the transmission electron microscope and a second phase II for acquisition of the hologram(s).

The sample to be studied is placed in the TEM.

Figure 2:
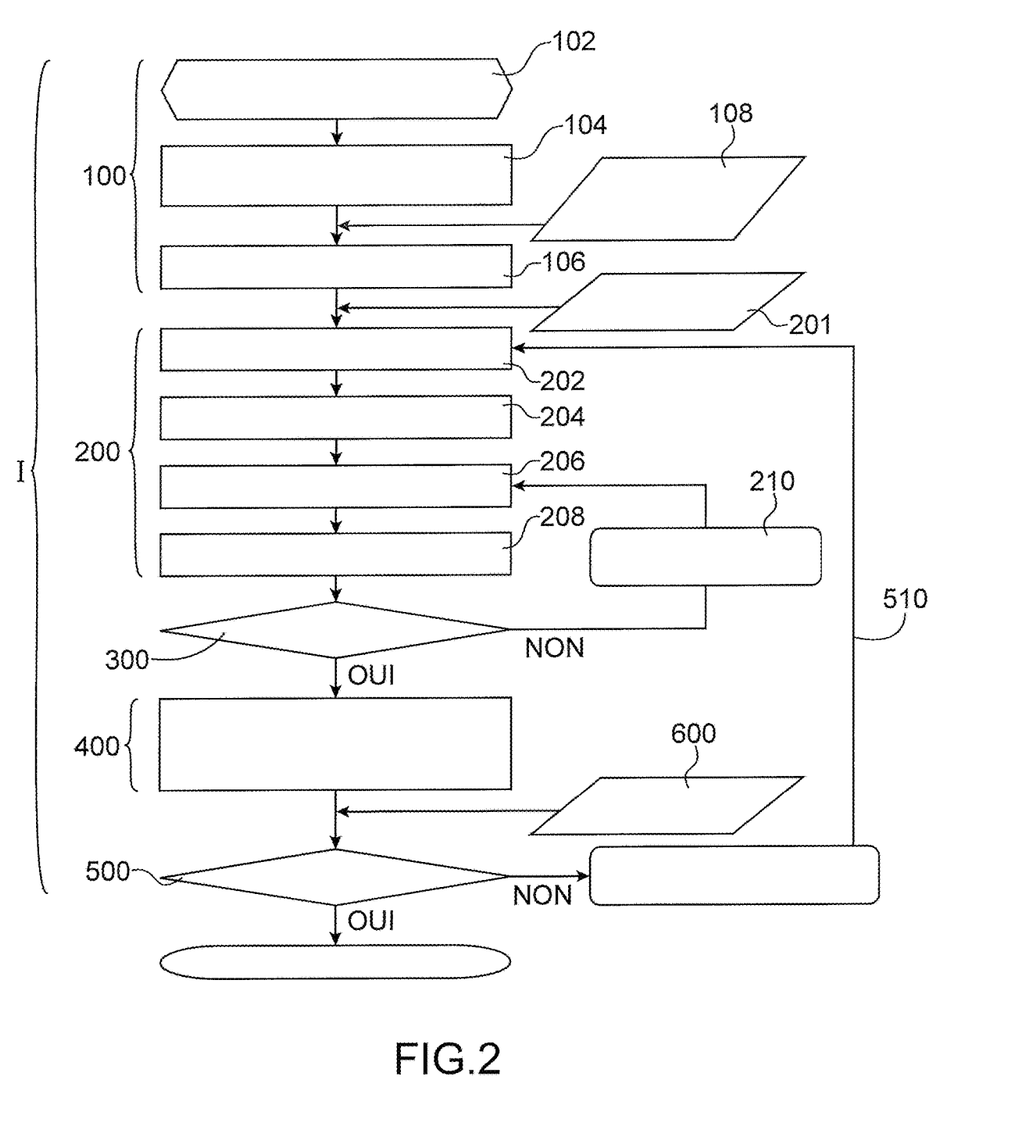
FIG. 2 is a flow chart of an example of a method of acquiring phase images according to the invention.

The first TEM adjustment phase comprises:
a step 100 to align the TEM in holography mode,
a step 200 to align the TEM in precession mode,
a step 300 to verify the stability of the sample in the image and diffraction plane,
a step 400 to put the electron biprism into place and adjust its characteristics,
a step 500 to check the stability of the sample and the hologram in the image plane.

The TEM alignment step 100 in holography mode is done without the presence of the biprism. The TEM is aligned in the optical configuration used for holography and is well known to an expert in the subject who will use a TEM in holography mode. The microscope is used in an optical configuration, in which the image plane of the objective lens is not conjugated with the physical location of the biprism in the microscope.

For example, this alignment comprises:
sub-step 102 to adjust the TEM in the optical configuration that will be used for holography, for example the choice of the enlargement in an optical configuration in which the image plane of the objective lens is not conjugated with the location of the biprism and the adjustment of the condenser system for optimised illumination for holography.
Sub-step 104 that consists of adjusting pivot points of the usual alignment of a TEM of the probe, the centre of rotation of the probe, objective astigmatism and focussing by adjusting the height of the sample, Advantageously, an image aberration corrector is used to correct aberrations introduced by the use of a precession angle. It is then possible to use larger values of the precession angle to more significantly attenuate artefacts related to diffraction.

Sub-step 106 that consists of aligning diffraction by adjusting its focus, diffraction astigmatism and centring diffraction.

Advantageously, sub-step 108 to activate precession mode of the microscope can be done before sub-step 104, to provide access to precession controls (("scan" and "descan"), while keeping a zero precession angle. Activation of precession mode at this moment can be used to adjust diffraction under exactly the same conditions as those used for precession.

Advantageously, objective, diffraction and intermediate lens currents and objective astigmatism are no longer modified until images have been acquired.

According to the invention, the next step is step 200 to align the TEM in precession mode.

If sub-step 106 to activate precession mode did not take place, precession mode is activated in sub-step 201 and is adjusted so as to apply a procession angle to the electron beam. The value of the precession angle α will advantageously be the same as the value that will be used for acquisition of images, or another value. For example, the precession angle α is of the order of 0.5°.

The purpose of step 200 is to obtain an immobile or quasi-immobile image both in the diffraction plane and in the image plane when precession is active.

In this application, it is considered that the image of the sample is stable in the image plane when its displacement is less than the spatial resolution required for the measurement, this is a factor limiting the final spatial resolution, for example of the order of 1 nm with a precession angle α of the order of 0.3°. It is considered that the diffraction image is immobile in the diffraction plane when it is visually stable. And it is considered that the hologram is sufficiently stable when its contrast is at least 5%; the contrast of the hologram is given by $(I_{max}-I_{min})/(I_{max}+I_{min})$, in which $I_{max}$ and $I_{min}$ are the maximum and minimum fringe intensities respectively.

The step 200 comprises alignment sub-steps in image mode and in diffraction mode that are made in the absence of precession compensation and in the presence of precession compensation.

For example, the alignment step 200 comprises
without precession compensation, a sub-step 202 consisting of aligning pivot points of precession means such that the electronic probe no longer moves on the sample. In precession mode, the fixed point of the probe is on the sample.
without precession compensation, sub-step 204 consisting of aligning distortion of precession means such that the transmitted and diffracted beams describe circles.
With precession compensation, a sub-step 206 consisting of adjusting the compensation translation of the probe after the precession compensation means have crossed through the sample, so that the image does not move in the image plane.
With precession compensation, a sub-step 208 for adjustment of the compensation of the precession angle, such that the diffraction image is stabilised.

At the end of step 200, during a step 300, it is checked if the stability of the sample in the image plane and the stability of the diffraction are sufficient. If these stabilities are not sufficient, step 206 is restarted.

In one alternative, before step 206 is repeated, the focus can be readjusted in a sub-step 210 by modifying the height such that the fixed point of the probe is actually in the plane of the sample.

As explained above, it is considered that the sample is sufficiently stable in the image plane when its displacement is less than the desired measurement resolution, and that diffraction is stable when the operator considers that it is visually stable.

When the sample is sufficiently stable in the image plane and diffraction is sufficiently stable, step 400 is performed during which new adjustment settings are made in the presence of the biprism.

Firstly, the biprism is inserted in the TEM downstream from the objective lens. Characteristics of the biprism are then adjusted, such as its position, orientation and voltage polarisation. Adjustment of the biprism is well known to an expert in holography. The position and orientation of the biprism are used to separate the reference wave from the object wave. Polarisation of the biprism helps to adjust the space between fringes and the width of the hologram to obtain the required spatial resolution and view field.

Furthermore, the probe can be made elliptical by adjusting the condenser astigmatism, to increase the spatial coherence of the beam in the direction perpendicular to the biprism. These adjustments can advantageously be made by modifying the precession angle, for example by using a 0° precession angle to limit movements.

In one alternative, an objective diaphragm can be put into place in the focal plane of the objective lens.

When the step 400 is terminated, the stability of the sample and the hologram in the image plane are checked in step 500. The precession angle α can be adjusted to the required value for acquisition of the hologram, for example 0.25°, before step 500.

It is considered that the sample is sufficiently stable in the image plane when the movement of the sample is less than the required spatial resolution, for example of the order of one nm with a precession angle α of the order of 0.3', and that the hologram is sufficiently stable when it has a contrast of at least 5%. The contrast of the hologram is given by $(I_{max}-I_{min})/(I_{max}+I_{min})$, in which $I_{max}$ and $I_{min}$ are equal to the maximum and minimum fringe intensities respectively.

If the sample and the hologram are not sufficiently stable in the image, step 202 is repeated without correcting the alignment of distortions of precession means, i.e. without applying step 204. This precession alignment can be readjusted on the hologram, i.e. starting again from step 202 leaving the biprism inserted so as to keep alignments of the biprism and condenser astigmatism done in step 400 (loop 510).

If the sample and the hologram are sufficiently stable, the first phase is completed and the second acquisition phase can take place directly. The precession angle is chosen and adjusted if it is different from that used for step 600.

The second phase II comprises acquisition of at least one hologram and then reconstruction of a phase image from the hologram(s).

The exposure time is a multiple of the time taken by the probe to make one revolution period.

According to another embodiment, during the step 500 to check the stability of the sample and the hologram in the image plane, if the stability is insufficient, the first phase is terminated and the second acquisition phase is started in which images are acquired in discrete precession mode: a series of holograms is recorded fixing the probe to each hologram; i.e. the probe is inclined by the required precession angle and with a fixed position of the probe on the circle describing the precession, the probe is then pivoted step by step such that it describes the circle, and a hologram is recorded in each step. For example, 90 holograms are recorded with an angular pitch of 4° so as to describe a completion revolution. The series of holograms can then be processed so as to find the average phase of the series of holograms. For example, this processing is described in document E. Voelkl and D. Tang, *Ultramicroscopy* 110, 447 (2010).

This discrete acquisition can avoid the effects of spatial averaging of the sample due to bad adjustment of the compensation of the sample movement.

The discrete acquisition can be used regularly, regardless of whether or not the alignment is satisfactory.

Figure 3:
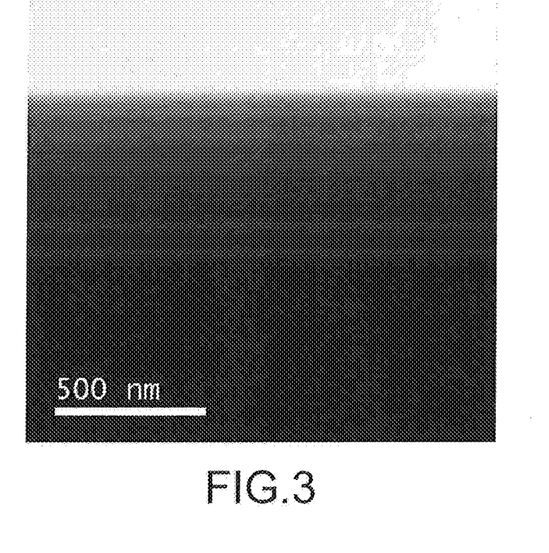
FIG. 3 is a photo of a sample at the scanning transmission electron microscope.

FIG. 3 is an image made using a scanning electron microscope by transmission of a silicon bevel made by a focussed ion beam, fringes of equal thickness can be seen.

Figure 4:
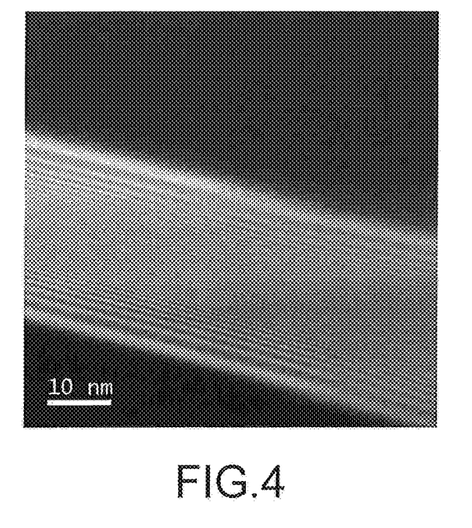
FIG. 4 is a hologram of the sample in FIG. 3 obtained using the acquisition method according to the invention.

FIG. 4 shows a hologram of the silicon bevel using a acquisition method in precession mode according to the invention. The precession is 0.25° and the revolution time is 1 s. The camera placement time was chosen to be equal to 4 s. Steps 100 to 500 in the first phase of the method according to the invention were done.

Figure 5:
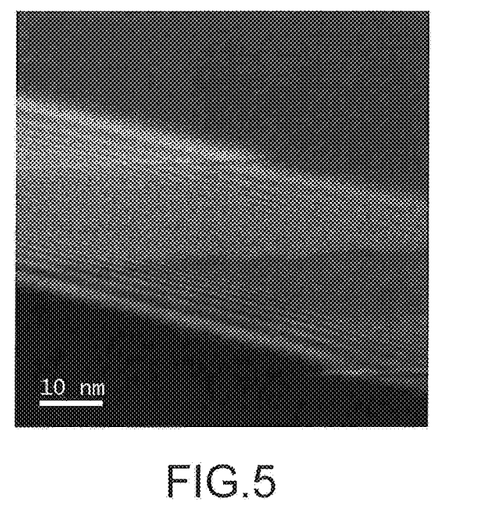
FIG. 5 is a hologram of the sample in FIG. 3 obtained using an acquisition method according to prior art.

For comparison, FIG. 5 shows a hologram of the silicon bevel using a classical off-axis holography method according to prior art, i.e. without precession.

Figure 6:
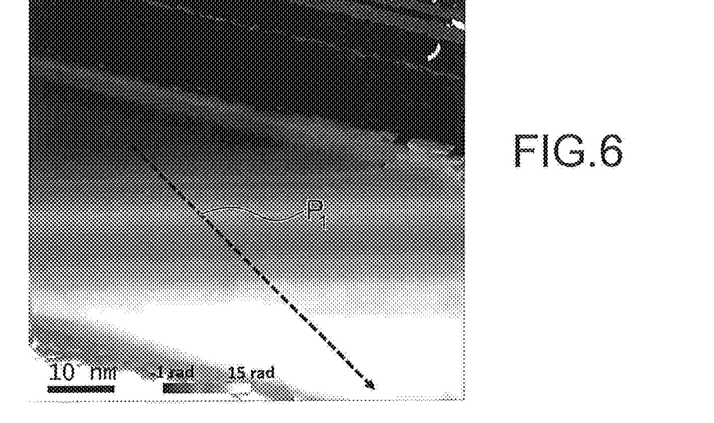
FIG. 6 is a phase image obtained from the hologram in FIG. 4.
Figure 7:
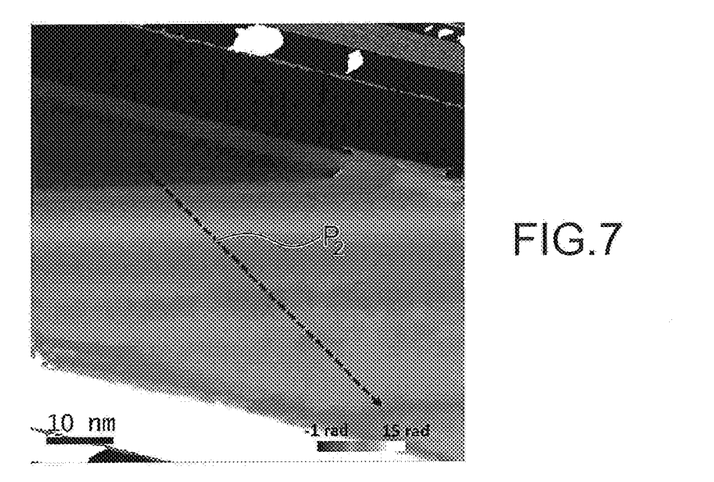
FIG. 7 is a phase image obtained from the hologram in FIG. 5.

FIGS. 6 and 7 are illustrations of phase images reconstructed from holograms in FIGS. 4 and 5 respectively. These images were obtained by a usual Fourier processing, with a mask limiting the resolution to 2 nm. The plot of profiles P1, P2 can be used to make a quantitative comparison.

Figure 8:
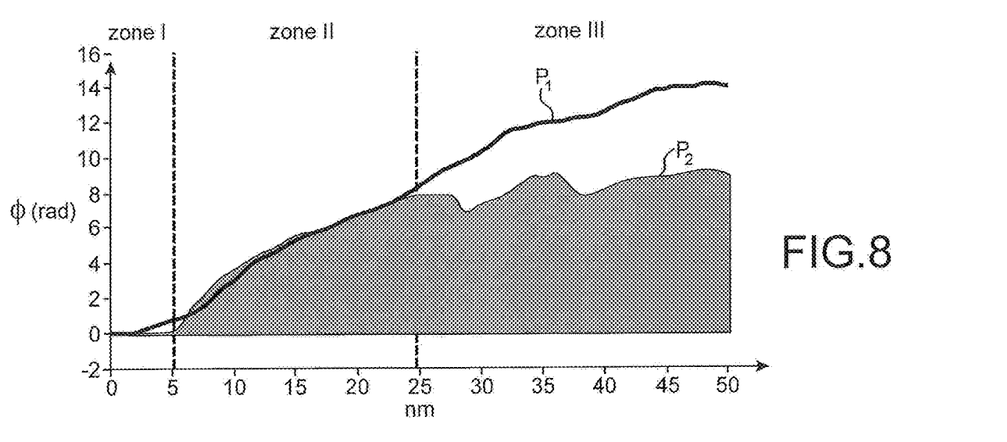
FIG. 8 is a graphic representation of the phase variation along profiles P1 and P2.

FIG. 8 represents phase values Φ in radians along profiles P1 and P2 in nm. Zone I is an empty zone, zone II is a zone containing amorphous silicon and zone III is a zone containing crystalline silicon.

It can be seen that artefacts related to diffraction effects are significantly reduced by comparing FIGS. 6 and 7, and it is even easier to see by comparing profiles P1 and P2 on the plot in FIG. 8. On FIG. 8, we can see that values obtained for the phase in the amorphous part of the sample obtained by electron holography with precession are equivalent to values obtained with electron holography. The increase in the linear thickness of the bevelled sample can be observed by a linear increase in the phase. However, in the case of classical electron holography (FIG. 7), the phase no longer increases linearly with the increase in thickness in the crystalline part of the sample. This is due to equal thickness fringes caused by diffraction effects and dynamic diffraction effects. The acquisition method according to the invention can correct these artefacts and result in a linear increase in the phase with the thickness also in the crystalline part (FIG. 6).

According to one alternative embodiment, the alignment step 100 of the TEM can be done in Lorentz mode, to make better use of the wide view field possible with this mode for holography.

According to one alternative embodiment, when one or more holograms is/are recorded, a mobile objective diaphragm can be envisaged; its displacement can be controlled to be a rotating displacement which is synchronous with the rotation of the diffraction pattern, so that a transmitted or diffracted beam can be selected precisely to perform holography experiments in bright field or in dark field.

In order to obtain an optical electron holography configuration in precession in dark field, the TEM is aligned in step 100 like a "dark field" type optical configuration, on a required diffracted beam. The diffracted beam is then in the optical axis instead of the transmitted beam. Steps 200 to 500 then take place.

With the acquisition method according to the invention, it is possible to:
- measure physical fields in a sample with artefacts, related to attenuated diffraction effects in the crystal.
- image the phase of a monocrystalline sample while remaining along the zone axis. For example the phase can be measured within a thin layer along the zone axis to reduce projection effects at interfaces.
- image the phase of a monocrystalline sample with non-uniform thickness. For example, the average internal potential (MIP) of materials in bevels or a thickness map by holography can be determined using the reconstructed amplitude image of the hologram, as described in the document Midgley, P. A. *Micron* 32, 167-184 (2001).
- image the phase of a curved monocrystalline sample. For example, we can measure magnetisation in ferromagnetic materials, polarisation in a ferroelectric material or measure the deformation field by electron holography in precession in dark field with a small precession angle, for example of the order of 0.1°, which partially overcomes the curvature effects of the crystal and to obtain a value of the deformation closer to the average value of the deformation through the thickness of the sample.

image the phase of a thick monocrystalline sample. For example, dopants in semiconductors can be determined, for which thick samples are necessary, from a measurement of their electrical potential.

image the phase of a polycrystalline sample.

make holograms on III-V semiconductors that have the special feature of creating diffraction contrasts that are difficult to eliminate, by varying the orientation of the sample.

The invention claimed is:

1. A method for acquisition of at least one hologram of a sample by off-axis holography using a transmission electron microscope, said transmission electron microscope comprising an electron beam source configured to generate an electron beam, at least one objective lens, a sample holder, at least one electron biprism and means of displacing the electron beam in precession mode upstream from the sample holder and a compensator of the precession downstream from the sample holder, said method comprising:

activation of the means of displacing the electron beam in the precession mode and the compensator and acquisition of a hologram of said sample in the precession mode.

2. The method according to claim 1, comprising the following steps, after placement of the sample in the transmission electron microscope:

alignment of the transmission electron microscope in holography mode without the at least one electron biprism, alignment of the transmission electron microscope in the precession mode, checking stability of an image of the sample in an image plane and stability of microscope diffraction, installing the at least one electron biprism in the transmission electron microscope and adjust characteristics of said at least one electron biprism, checking stability of the sample and stability of the hologram in the image plane, and acquire the hologram.

3. The method according to claim 2, wherein the stability of the image of the sample in the image plane is considered to be sufficient when displacement of the image of the sample in the image plane is less than a required measurement resolution, and the stability of the microscope diffraction is sufficient when an operator considers that the microscope diffraction is visually stable.

4. The method according to claim 2, wherein, if the stability of the image of the sample in the image plane and the stability of the microscope diffraction are not sufficient, the alignment step in the precession mode is at least partly repeated.

5. The method according to claim 4, wherein a height of the sample relative to the at least one objective lens is modified before the alignment step in the precession mode is repeated.

6. The method according to claim 1, wherein the checking the stability of the image of the sample and the hologram in the image plane is performed after the at least one electron biprism has been put into place in the transmission electron microscope and characteristics of said at least one electron biprism have been adjusted.

7. The method according to claim 2, wherein the stability of the image of the sample in the image plane is considered to be sufficient when movement of the image of the sample is less than a required spatial resolution, and wherein the stability of the hologram is sufficient when contrast of the hologram is at least 5%.

8. The method according to claim 6, wherein, if the stability of the image of the sample is not satisfactory, the step to acquire at least one the hologram is an acquisition of discrete holograms.

9. The method according to claim 1, wherein the precession mode is activated during the alignment step in the holography mode or not later than at a beginning of the alignment step in the precession mode.

10. The method according to claim 2, wherein a precession angle is not zero during adjustment of the characteristics of said at least one electron biprism.

11. The method according to claim 2, wherein said at least one electron biprism is inserted during the alignment of the transmission electron microscope in the precession mode.

12. The method according to claim 1, wherein a precession angle is adjusted to a value given for the acquisition of said hologram, at least at a beginning of the acquisition of the hologram.

13. A method of obtaining at least one phase image of the sample, comprising: the method of acquiring the at least one hologram according to claim 1, and a step to obtain at least one phase image by processing of said at least one hologram obtained at the end of the acquisition method of acquiring the at least one hologram.

14. A method of determining at least one physical field of the sample comprising the method of obtaining at least one phase image according to claim 13 and a processing step of said phase image to determine said physical field.

15. The method according to claim 1, wherein the activation of the compensator comprises activation of coils positioned upstream of the at least one objective lens, wherein the coils are electrically powered so as to produce a magnetic field compensating for deflection.

16. The method according to claim 1, wherein the transmission electron microscope further comprises a condenser located upstream of the means for displacing the electron beam in the precession mode.

* * * * *